United States Patent
Krishnan et al.

(10) Patent No.: US 6,709,932 B1
(45) Date of Patent: Mar. 23, 2004

(54) METHOD FOR IMPROVING GATE OXIDE INTEGRITY AND INTERFACE QUALITY IN A MULTI-GATE OXIDATION PROCESS

(75) Inventors: Anand T. Krishnan, Richardson, TX (US); Vijay Reddy, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/232,154

(22) Filed: Aug. 30, 2002

(51) Int. Cl.⁷ .......................................... H01L 21/8234
(52) U.S. Cl. ...................... 438/275; 438/258; 438/775
(58) Field of Search ................... 438/275, 258, 438/775

(56) References Cited

U.S. PATENT DOCUMENTS

| | | | |
|---|---|---|---|
| 5,254,489 A | * 10/1993 | Nakata | 438/258 |
| 5,633,202 A | 5/1997 | Brigham et al. | |
| 5,960,289 A | * 9/1999 | Tsui et al. | 438/275 |
| 5,989,962 A | * 11/1999 | Holloway et al. | 438/275 |
| 6,033,958 A | * 3/2000 | Chou et al. | 438/275 |
| 6,063,670 A | * 5/2000 | Lin et al. | 438/275 |
| 6,087,225 A | * 7/2000 | Bronner et al. | 438/275 |
| 6,103,556 A | 8/2000 | Nishimura et al. | |
| 6,171,911 B1 | * 1/2001 | Yu | 438/275 |
| 6,184,083 B1 | * 2/2001 | Tsunashima et al. | 438/257 |
| 6,207,509 B1 | * 3/2001 | Inoue | 438/275 |
| 6,225,167 B1 | * 5/2001 | Yu et al. | 438/275 |
| 6,235,591 B1 | * 5/2001 | Balasubramanian et al. | 438/275 |
| 6,242,300 B1 | * 6/2001 | Wang | 438/241 |
| 6,261,889 B1 | 7/2001 | Ono | |
| 6,432,776 B1 | * 8/2002 | Ono | 438/275 |
| 6,511,887 B1 | * 1/2003 | Yu et al. | 438/275 |
| 6,551,884 B2 | * 4/2003 | Masuoka | |
| 2002/0068405 A1 | 6/2002 | Ono | |

* cited by examiner

*Primary Examiner*—Long Pham
(74) *Attorney, Agent, or Firm*—Jacqueline J. Garner; W. James Brady, III; Frederick J. Telecky, Jr.

(57) ABSTRACT

One aspect of the invention relates to a method of manufacturing a multi-gate integrated circuit device. According to the method, a protective coating substantially prevents processes used to form a second gate dielectric from affecting a first gate dielectric. In an exemplary process, an oxide gate dielectric is grown for peripheral region transistors, a protective coating of silicon nitride is deposited over the peripheral region gate oxide, the oxide and protective coating are etched from a core region, and then a second oxide dielectric is grown for core region transistors while the silicon nitride coating substantially prevents further oxide growth in the peripheral region. The protective coating can also prevent nitridation of the core region gate dielectric from affecting the peripheral region gate dielectric.

13 Claims, 3 Drawing Sheets

METHOD FOR IMPROVING GATE OXIDE INTEGRITY AND INTERFACE QUALITY IN A MULTI-GATE OXIDATION PROCESS

FIELD OF THE INVENTION

The present invention relates generally to the field of integrated circuit processing, and more particularly relates to a method of manufacturing chips having a multiplicity of gate oxide thicknesses and/or compositions.

BACKGROUND OF THE INVENTION

For some years, there has been a demand in the semiconductor industry for system-on-chip devices. These devices incorporate multiple functions on a single chip. To achieve these functions, multiple transistor element types, each operated by a different power supply voltage, are mounted together. For example, some constructions include a peripheral region having I/O (Input/Output) device transistors that operate at a relatively high voltage, a step-down circuit to reduce the voltage, and a core region having logic device transistors that operate at a lower voltage.

Manufacturing reliable high-quality devices with both high and low voltage transistors has proved challenging. High and low voltage transistors are formed with gate dielectrics having differing thicknesses and/or compositions. Processes that form gate dielectrics can have a deleterious effects on previously formed gate dielectrics and their substrate interfaces. For example, growing a second gate dielectric can cause regrowth of a first gate oxide.

When oxides are grown in multiple stages, they have lower quality substrate interfaces as compared to oxides grown in a single stage. A low quality interface is characterized at least in one respect by having a large number of weak or dangling bonds. These bonds can cause hot carrier problems in the channel region and a phenomenon referred to as Negative Bias Temperature Instability (NBTI). NBTI primarily affects PMOS transistors and involves interface state generation and positive charge formation in the dielectric when a negative bias voltage is applied to the transistor. Over time, NBTI causes the threshold voltage of PMOS transistors to increase. Previous efforts to mitigate NBTI have included doping the substrate with fluorine, which diffuses to the interface where it reacts to passivate dangling bonds, and treating the substrate to replace hydrogen with deuterium. Deuterium binds more strongly to silicon than hydrogen. These efforts to reduce NBTI have met with limited success. There remains an unsatisfied need for processes of forming multi-gate chips that have high quality gate dielectrics and substrate interfaces, that are relatively unsusceptible to NBTI, and exhibit improved gate oxide integrity and immunity from process induced damage.

SUMMARY OF THE INVENTION

The following presents a simplified summary in order to provide a basic understanding of some aspects of the invention. This summary is not an extensive overview of the invention. It is intended neither to identify key or critical elements of the invention nor to delineate the scope of the invention. Rather, the primary purpose of this summary is to present some concepts of the invention in a simplified form as a prelude to the more detailed description that is presented later.

One aspect of the invention relates to a method of manufacturing a multi-gate integrated circuit device. According to the method, a protective coating is employed that substantially prevents processes used to form a second gate dielectric from affecting a first gate dielectric. In an exemplary process, an oxide gate dielectric is grown for peripheral region transistors, and a protective coating is deposited over the peripheral region gate oxide. In one example, the protective coating is silicon nitride, however, other materials such as silicon carbide may be employed. The oxide and protective coating subsequently are etched from a core region, and then a second oxide gate dielectric is grown for core region transistors while the silicon nitride coating substantially prevents further oxide growth in the peripheral region. The protective coating can also prevent nitridation of the core region gate dielectric from affecting the peripheral region gate dielectric.

The nitridation prevention, according to one aspect of the present invention, may be of use in cases where there is only one gate oxide thickness, but for some reason, it is desired to not have any nitrogen incorporation in some transistors. For example, nitridation prevention may be utilized to improve noise performance, and may be useful in cases where high-speed digital circuits are integrated with analog applications. Avoiding nitridation also improves the plasma damage immunity of the thick oxide in a multi-gate process.

According to one aspect of the present invention, the formation of multiple, differing gate dielectrics is provided, wherein a formation of a second subsequently formed gate dielectric does not negatively impact an interface quality of a first gate dielectric. The method comprises forming a first gate dielectric over both a first and second region of a semiconductor substrate. A protective coating such as silicon nitride is then formed over the first gate dielectric, and the silicon nitride and the first gate dielectric are then removed in the second region. A second gate dielectric is then formed in the second region, wherein the protective coating prevents re-growth associated with the first gate dielectric to occur during the second gate dielectric formation. Control gates are then formed over the first and second gate dielectrics (either with or without protective coating removal) to form gate structures in the first and second regions, respectively.

According to another aspect of the present invention, the first gate dielectric and protective coating thereover are formed in the first region and the second gate dielectric is subsequently formed in the second region. The second gate dielectric is then subjected to a nitridation to thereby increase the dielectric constant thereof and decrease any potential boron diffusion therethrough. The nitridation of the second gate dielectric does not impact the first gate dielectric due to the protective coating thereover. The protective coating may subsequently be removed, if desired, followed by the formation of conductive control gates thereover.

According to still another aspect of the present invention, a multi-gate semiconductor device is disclosed. The device comprises one or more high voltage transistors having a first gate dielectric in a first region and one or more low voltage transistors having a second gate dielectric in a second region of the substrate. The first gate dielectric is different than the second gate dielectric and includes a layer of silicon nitride. In addition, the second gate dielectric may be nitrided independently of the first gate dielectric.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
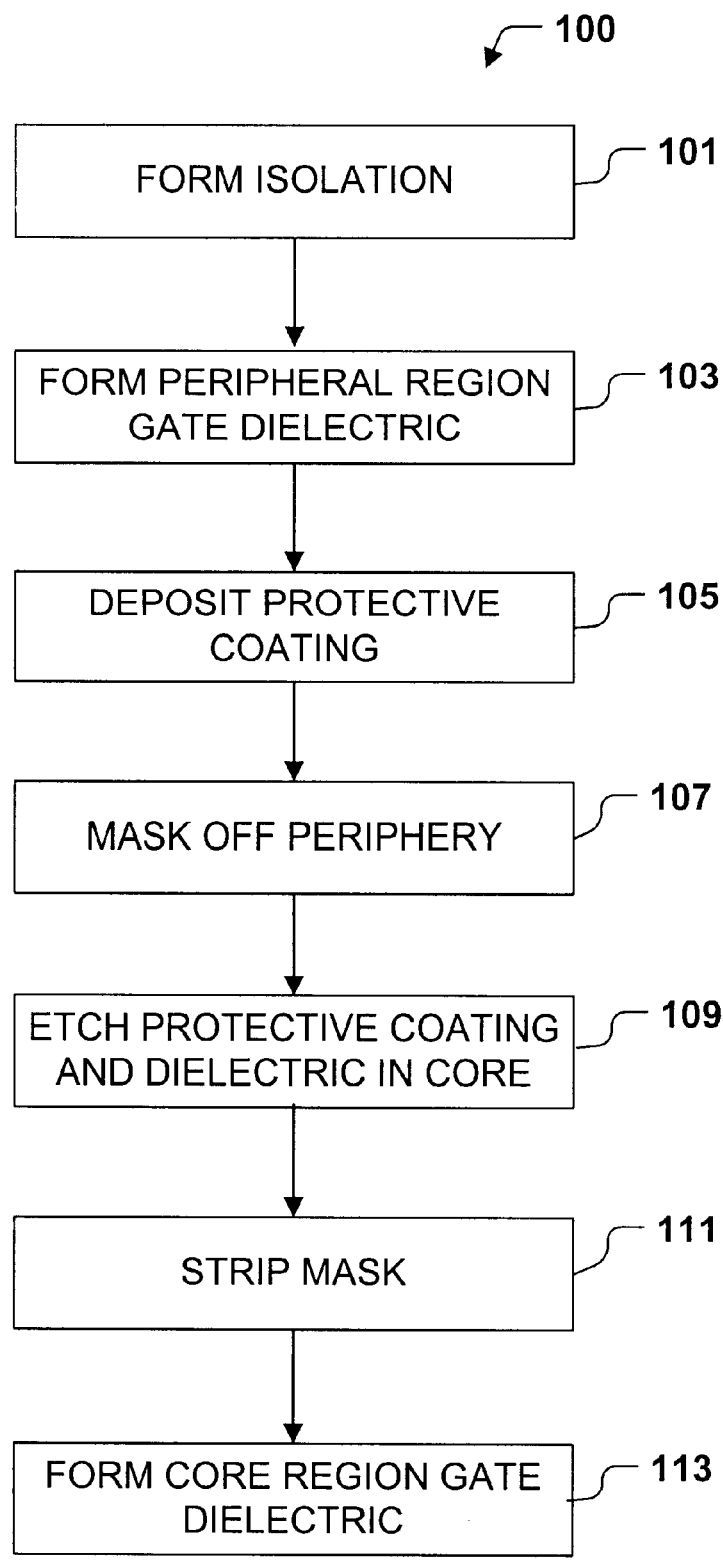
FIG. 1 is a flow chart illustrating a process according to one aspect of the present invention.

The present invention will now be described with reference to the attached drawings, wherein like reference numerals are used to refer to like elements throughout. FIG. 1 provides a flow chart of a process 100 for manufacturing a multi-gate integrated circuit device in accordance with one aspect of the present invention. In the present context, a multi-gate integrated circuit device means a device in which a plurality of transistors differing with respect to gate dielectric thickness and/or composition are formed in/on a cohesive semiconductor substrate, such as an individual semiconductor wafer chip.

Although the process or method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated acts or events may be required to implement a methodology in accordance with the present invention.

Process 100 includes forming isolation regions in a semiconductor substrate, act 101, forming a peripheral region gate dielectric, act 103, and depositing a protective coating over the peripheral region gate dielectric, act 105. The process 100 further includes masking off the peripheral region, act 107, etching away the protective coating and the peripheral region gate dielectric from a core region, act 109, stripping the mask, act 111, and forming a core region gate dielectric, act 113.

A semiconductor substrate includes a semiconductor. Examples of semiconductors include, without limitation, Si (including wafers and silicon on insulator structures), GaAs, and InP. In addition to a semiconductor, the semiconductor substrate may include various elements therein and/or layers thereon. These can include metal layers, barrier layers, dielectric layers, device structures, active elements and passive elements including gates, word lines, source regions, drain regions, bit lines, bases emitters, collectors, conductive lines, conductive vias, etc.

For purposes of explaining the present invention, the semiconductor substrate is logically divided into a peripheral region, in which a first set of transistors having a first gate dielectric are formed, and a core region, in which a second set of transistors having a second gate dielectric are formed. The core and peripheral regions need not be contiguous. While a peripheral region may be devoted to I/O functions and a core region devoted to logic or other functions, the terms "peripheral" and "core" are used purely for convenience and imply no geometric or functional limitations beyond what would be implied by terms such as "first" and "second".

Figure 2:
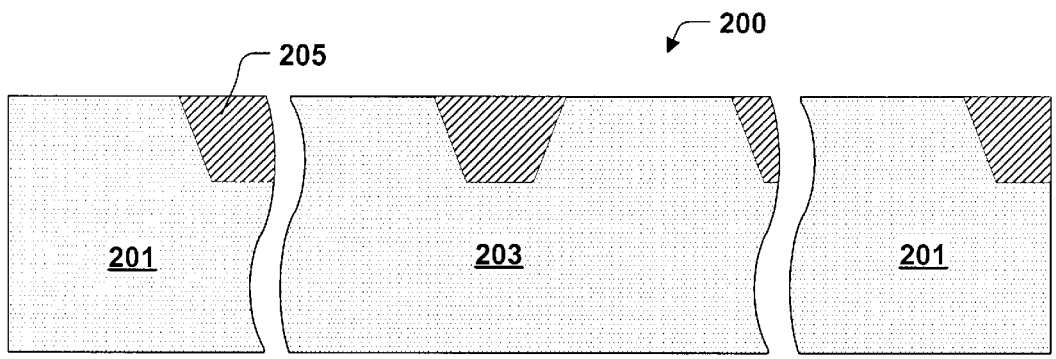
FIG. 2 is a fragmentary cross section diagram illustrating a semiconductor substrate in which isolation regions formed via STI or LOCOS, for example, have been formed.

Act 101 comprises forming isolation regions in the semiconductor substrate. The isolation regions are typically formed in both the core and peripheral regions, although they may be formed in only one of these regions or neither (act 101 is optional). Isolation regions can be of any suitable type, including those formed by local oxidation of silicon (LOCOS) and shallow trench isolation (STI) processes. In addition, source/drain regions (not shown) may be formed in the substrate 200 in either or both regions (periphery or core) prior to the gate dielectric formations. Due to thermal budget issues, however, the source/drain regions are preferably formed later. FIG. 2 illustrates an exemplary semiconductor substrate 200 having a periphery region 201, a core region 203, and STI regions 205.

Act 103 forms a peripheral region gate dielectric over the semiconductor surface. The term gate dielectric describes one or more layers of material that collectively provides a suitable barrier between a control gate and a channel region of a transistor. A gate dielectric can include a plurality of sub-layers, such as layers to improve binding, limit dopant diffusion, and increase the capacitive coupling between the gate and the channel.

Most commonly, the gate dielectric includes silicon dioxide. For very small devices, however, it is often desirable to employ a material that has a higher dielectric constant than silicon dioxide. For example, silicon oxynitride has a higher dielectric constant than pure silicon dioxide. Materials with substantially higher dielectric constants than silicon dioxide can also be employed and are referred to as high-k dielectrics. High-k dielectrics include silicates, aluminates, titanates, and metal oxides. Examples of silicate high-k dielectrics include silicates of Ta, Al, Ti, Zr, Y, La and Hf, including Zr and Hf doped silicon oxides and silicon oxynitrides. Examples of aluminates include transition metal aluminates, such as compounds of Zr and Hf. Examples of titanate high-k dielectrics include $BaTiO_3$, $SrTiO_3$, and $PdZrTiO_3$. Examples of metal oxide high-k dielectrics include oxides of refractory metals, such as Zr and Hf, and oxides of Lanthanide series metals, such as La, Lu, Eu, Pr, Nd, Gd, and Dy. Additional examples of metal oxide high-k dielectrics include $Al_2O_3$, $TiO_2$, $Ta_2O_5$, $Nb_2O_5$ and $Y_2O_3$.

Figure 3:
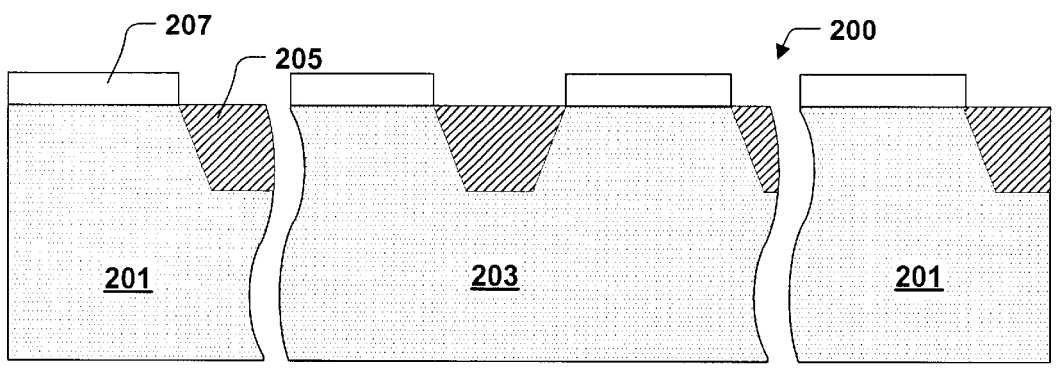
FIG. 3 is a fragmentary cross section diagram illustrating the substrate of FIG. 2 after growth of a peripheral region gate oxide.

A gate dielectric can be grown or deposited. In one exemplary embodiment, the peripheral region gate dielectric is grown. Dielectrics that are grown generally provide a better interface with the substrate than dielectrics that are deposited. Silicon dioxide can be grown, for example, by exposing a silicon substrate to an oxygen-containing atmosphere at a temperature in the range from about 900° C. to about 1000° C. By including a source of nitrogen as well as oxygen, a silicon oxynitride dielectric can be grown. FIG. 3 illustrates the substrate 200 after growing a peripheral region gate dielectric 207 in both the core region 201 and the peripheral region 203. Alternatively, the peripheral region gate dielectric can be formed by spin coating or CVD. In one embodiment, the peripheral region gate dielectric is from about 10 Å to about 1000 Å thick. In another embodiment, the dielectric is from about 20 Å to about 200 Å thick. In a further embodiment, the dielectric is from about 22 Å to about 85 Å thick.

Act 105 comprises depositing a protective coating over the peripheral region gate dielectric. Preferably the protective coating has a composition and thickness sufficient to substantially prevent oxide growth at an interface between the peripheral region gate dielectric and the semiconductor beneath the protective coating when the semiconductor substrate is subsequently exposed to oxidizing conditions such as may be employed to form a core region gate dielectric. Preferably, the protective coating comprises silicon nitride, which can be deposited by CVD, however, any appropriate material which meets the above stated conditions may be employed and is contemplated as falling within the scope of the present invention. For example, the protective coating may comprise silicon carbide.

Figure 4:
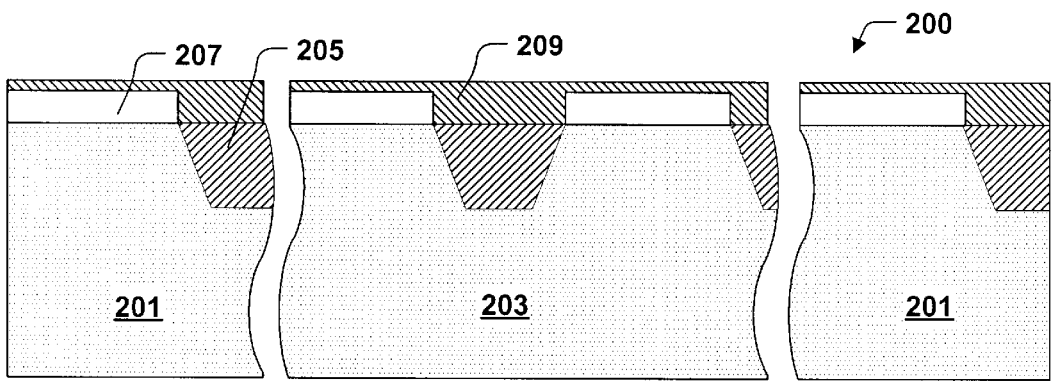
FIG. 4 is a fragmentary cross section diagram illustrating the substrate of FIG. 3 after deposition of a protective coating.

A typical CVD process for depositing silicon nitride involves a silicon source gas, for example $SiH_4$, and a nitrogen source gas, for example $NH_3$, and is carried out at a relatively high temperature, for example, a temperature in the range from about 600° C. to about 700° C. In one embodiment, the protective coating is from about 15 Å to about 100 Å thick. In another embodiment, the protective coating is from about 20 Å to about 60 Å thick. In a further embodiment, the protective coating is from about 20 Å to about 30 Å thick. FIG. 4 illustrates the substrate 200 after providing a protective coating 209 over the gate oxide 207.

Acts 107, 109, and 111 are part of a lithographic process carried out to pattern the protective coating 209 and the peripheral region gate dielectric 207. Lithography refers to processes for pattern transfer between various media. In lithography for integrated circuit fabrication, the substrate is coated uniformly with a radiation-sensitive film, the resist. The film is selectively exposed with radiation (such as visible light, ultraviolet light, x-rays, or an electron beam) through an intervening master template, the mask or reticle, forming a particular pattern. Exposed areas of the coating become either more or less soluble than the unexposed areas, depending on the type of coating, in a particular solvent developer. The more soluble areas are removed with the developer in a developing step. The less soluble areas remain on the substrate forming a patterned coating. The pattern of the coating corresponds to the image, or negative image, of the reticle.

Figure 5:
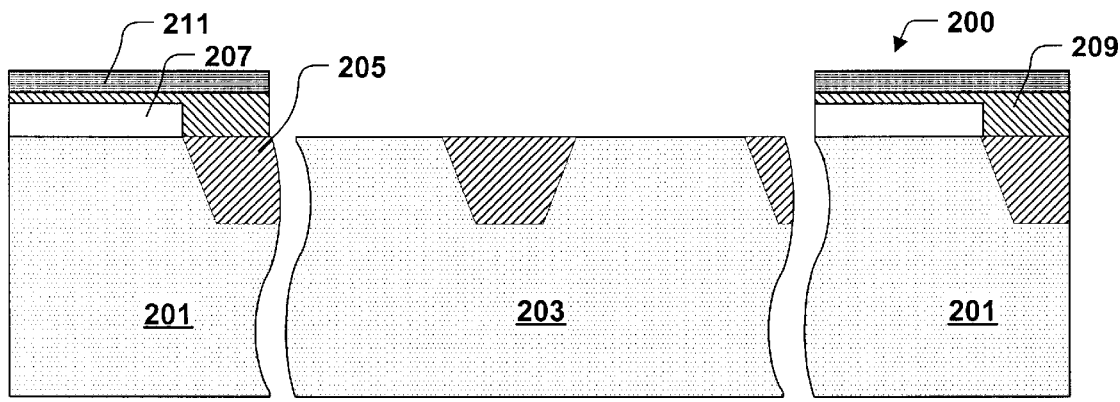
FIG. 5 is a fragmentary cross section diagram illustrating the substrate of FIG. 4 after masking and etching to remove the protective coating and the peripheral region gate oxide from the core.

Act 107 comprises forming and patterning a resist to mask off the peripheral region, and Act 109 comprises etching the protective coating and the peripheral region gate dielectric in the core region while the resist mask protects these layers in the peripheral region. FIG. 5 illustrates the substrate 200 after etching the protective coating 209 and the peripheral region gate dielectric 207 from the core region 203 using the resist 211 as an etch mask. Act 111 comprises stripping the resist mask 211, for example, via ashing.

Act 113 comprises forming a core region gate dielectric 213 in the core region 203 of the substrate 200. Like the peripheral region gate dielectric 207, the core region gate dielectric 213 can be of any suitable type and can be formed by any suitable process. Preferably, the core region gate dielectric is grown. Generally, oxidizing conditions are employed in forming the core region gate dielectric and, but for the protective coating, oxide growth would also take place in the peripheral region 201. In one embodiment, the core region gate dielectric is from about 10 Å to about 1000 Å thick. In another embodiment, the dielectric is from about 13 Å to about 100 Å thick. In a further embodiment, the dielectric is from about 13 Å to about 40 Å thick.

In a preferred embodiment, plasma nitridation is employed to nitridate silicon dioxide grown for the core region gate dielectric 213. Plasma nitridation refers to a process wherein the substrate (e.g., in the core region 203) is treated with nitrogen radicals. The nitrogen radicals react with silicon dioxide to form silicon oxynitride. Plasma nitridation of a silicon dioxide gate dielectric is useful in preventing boron diffusion and increasing the dielectric constant. Plasma nitridation of a core region gate dielectric, however, can be detrimental to a peripheral region gate dielectric. Where the peripheral region gate dielectric includes a silicon dioxide layer thicker than a core region silicon dioxide oxide layer, an appropriate plasma nitrogen treatment for the core region may damage the peripheral region dielectric, cause nitrogen to deposit non-uniformly in the peripheral region, and compromise the peripheral region gate dielectric's integrity and performance. Nitrogen can also enhance NBTI and hot carrier effects in the peripheral region.

Figure 6:
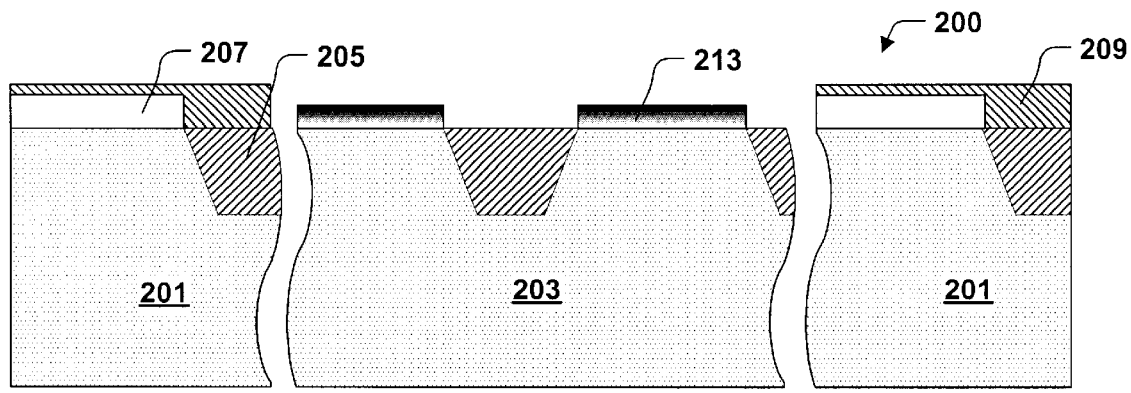
FIG. 6 is a fragmentary cross section diagram illustrating the substrate of FIG. 5 after stripping the mask, growing a core region gate oxide, and nitridating the core region gate oxide.

The protective coating 209 over the peripheral region gate dielectric 207 can protect it from the effects of nitridation. A silicon nitride protective coating, for example, is effective for this purpose. FIG. 6 illustrates the substrate 200 after growing and nitridating a core region gate dielectric 213 in the core region 203. As stated above, nitridation prevention may also be useful in cases where there is only one gate oxide thickness, but it is desired to not have nitrogen incorporation therein. Such exemplary instances include transistors requiring special noise performance, high-speed digital circuits that are integrated with analog circuitry. Furthermore, nitridation prevention also improves plasma damage immunity of the thick oxide in a multi-gate process.

Figure 7:
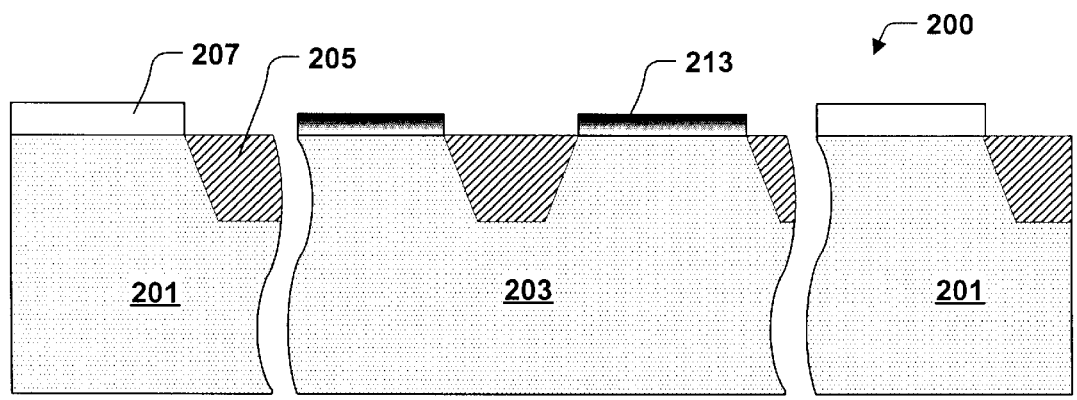
FIG. 7 is a fragmentary cross section diagram illustrating the substrate of FIG. 6 after stripping the protective coating.

Optionally, the protective coating can be removed after the core region gate dielectric is formed. For example, a silicon nitride protective film can be stripped with hot phosphoric acid. FIG. 7 illustrates the substrate 200 after removing the protective coating 209. However, in some cases, particularly where the peripheral region gate dielectric is relatively thick such that the overall thickness associated therewith is not excessively increased by the protective coating, the protective coating need not be removed. For example, a 15 Å silicon nitride protective coating does not necessarily have to be removed from a peripheral region gate oxide layer that is at least about 70 Å thick.

The protective coating can become part of the peripheral region gate dielectric. A further aspect of the present invention relates to a multi-gate integrated circuit device in which a first gate dielectric includes a layer of a protective coating material, such as a silicon nitride. Subsequent processing may occur, for example, the formation of control gates (e.g., polysilicon), source/drain regions, silicides, multi-level interconnects, etc., as may be desired.

While the particular process examples given above describe forming two gate dielectrics, the invention applies to processes for forming multi-gate devices with three or more gate dielectrics. Optionally, a second protective layer can be provided over the second gate dielectric (the core region gate dielectric in the above examples) prior to forming a third gate dielectric and so on. The present invention is particularly useful when growing three or more gate dielectric as phenomena such as NBTI become more pronounced as the number of stages of oxide growth increases.

The present invention is effective in improving interface quality. In some cases, however, further improvements may be obtained be combining the present invention with other methods for improving interface quality. Such other methods include doping the semiconductor with fluorine and processing and/or treating the substrate to provide deuterium in place of hydrogen at the interface.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of manufacturing a multi-gate integrated circuit device, comprising:

forming a first gate dielectric in a first region on a semiconductor substrate;

providing a protective coating over the first gate dielectric; and forming a second gate dielectric in a second region on the semiconductor substrate while the protective coating substantially prevents oxidation of the semiconductor substrate in the first region at an interface between the first gate dielectric and the semiconductor substrate, wherein forming the second gate dielectric comprises:
   growing an oxide; and
   nitridating the oxide with plasma nitridation while the protective coating substantially prevents nitridation from affecting the first gate dielectric.

2. The method of claim 1, further comprising stripping the protective coating after forming the second gate dielectric.

3. The method of claim 1, wherein the protective coating comprises silicon nitride.

4. The method of claim 1, wherein the first gate dielectric is grown in a thermal process.

5. The method of claim 1, wherein the second gate dielectric comprises a high-k dielectric.

6. The method of claim 1, further comprising doping the semi-conductor substrate in the first region with fluorine.

7. The method of claim 1, further comprising treating the semiconductor substrate in the first region to replace ordinary hydrogen with deuterium.

8. The method of claim 1, further comprising forming a third gate dielectric in a third region of the semiconductor substrate while the protective coating substantially prevents oxidation of the semiconductor substrate at the interface.

9. The method of claim 1, wherein the protective coating is from about 15 Å to about 60 Å thick.

10. A method of manufacturing a semiconductor device, comprising:

growing a first gate dielectric on a semiconductor substrate having a core region and a peripheral region;

depositing a silicon nitride coating over the first gate dielectric;

selectively etching to remove the silicon nitride coating and the first gate dielectric from the core region, but not the peripheral region;

growing a second gate dielectric on the semiconductor substrate in the core region; and performing a plasma nitridation of the second gate dielectric, wherein the silicon nitride coating prevents nitridation of the first gate dielectric in the peripheral region.

11. The method of claim 10, further comprising growing a third gate dielectric while the silicon nitride coating substantially prevents oxidation of the semiconductor substrate at the interface between the first gate dielectric and the semiconductor substrate.

12. The method of claim 10, further comprising forming a control gate over the silicon nitride coating and the second gate dielectric, respectively, wherein the silicon nitride coating and the first gate dielectric form a transistor dielectric for a transistor in the peripheral region, and the second gate dielectric forms a transistor dielectric for a transistor in the core region.

13. The method of claim 10, further comprising:

removing the silicon nitride over the first gate dielectric in the peripheral region; and forming a control gate over the first gate dielectric and the second gate dielectric, respectively, wherein the first gate dielectric forms a transistor dielectric for a transistor in the peripheral region, and the second gate dielectric forms a transistor dielectric for a transistor in the core region.

* * * * *